United States Patent [19]
Ikeda et al.

[11] Patent Number: 6,132,553
[45] Date of Patent: Oct. 17, 2000

[54] SUBSTRATE PROCESSING APPARATUS

[75] Inventors: Fumihide Ikeda; Yasuhiro Inokuchi, both of Tokyo, Japan

[73] Assignee: Kokasai Electric Co., Ltd., Tokyo, Japan

[21] Appl. No.: 09/090,216

[22] Filed: Jun. 4, 1998

[30] Foreign Application Priority Data

Jun. 4, 1997 [JP] Japan ................................. 9-161834

[51] Int. Cl.[7] ............................... C23F 1/02; C23C 16/00

[52] U.S. Cl. ......................... 156/345; 118/724; 118/725

[58] Field of Search ........................... 156/345; 118/724, 118/725

[56] References Cited

U.S. PATENT DOCUMENTS 4,920,918   5/1990   Adams et al. ........................ 118/724

*Primary Examiner*—Anthony J. Weier

[57] ABSTRACT

A substrate processing apparatus includes a reaction container for processing a substrate therein. The reaction container is provided with two open ends. The reaction container includes a central cylindrical body and two flanges respectively provided at the both open ends. The central cylindrical body includes at its both ends thin portion which are thinner than the central portion of the central cylindrical body, the flanges are respectively provided with flange connecting portions which are thinner than the central portion of the central cylindrical body, and the thin portions of the central cylindrical body and the flange connecting portions are welded together.

15 Claims, 3 Drawing Sheets

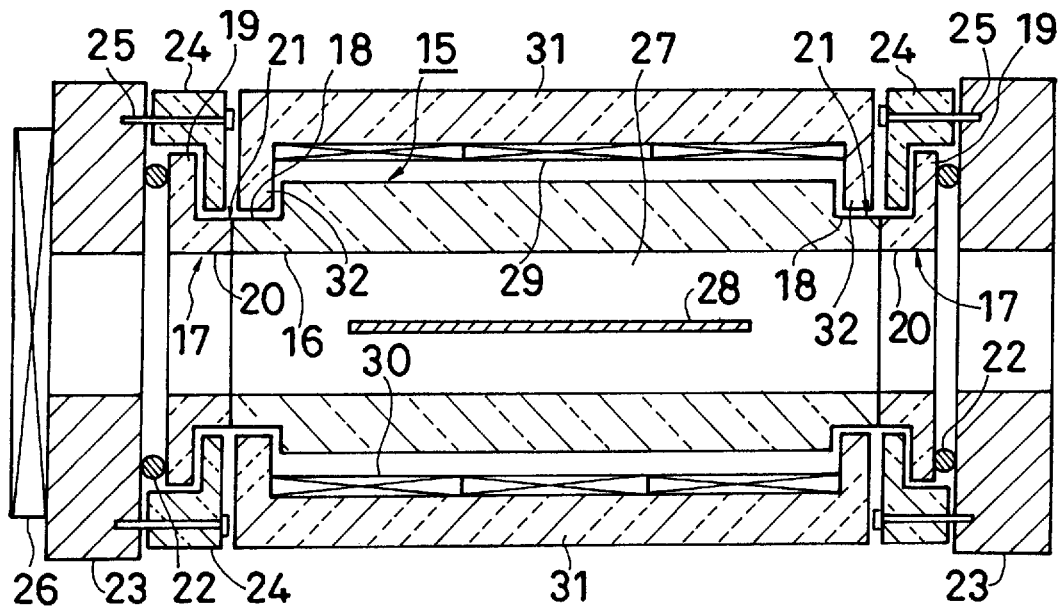
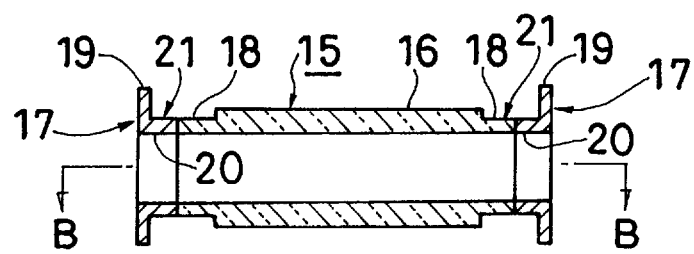
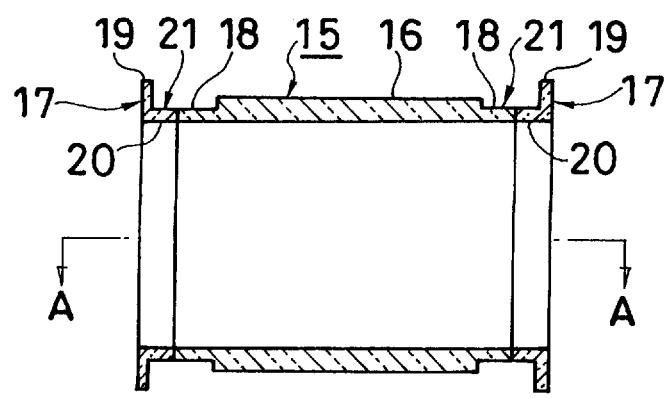

FIG. 4
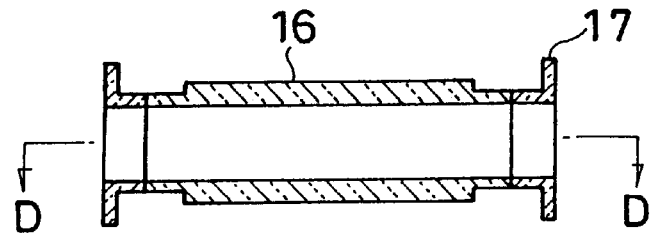
FIG. 5
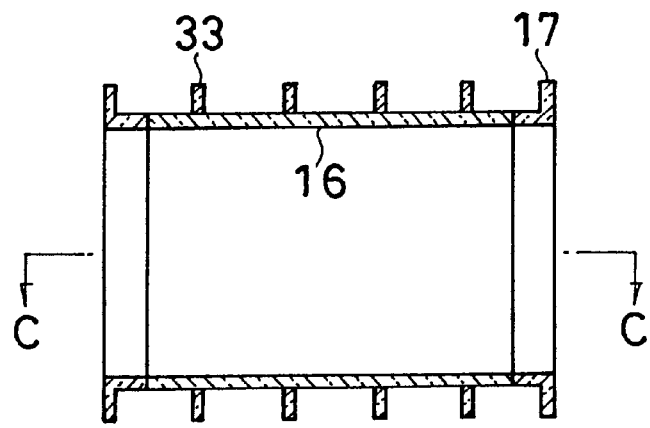
FIG. 6 (COMPARATIVE EXAMPLE)
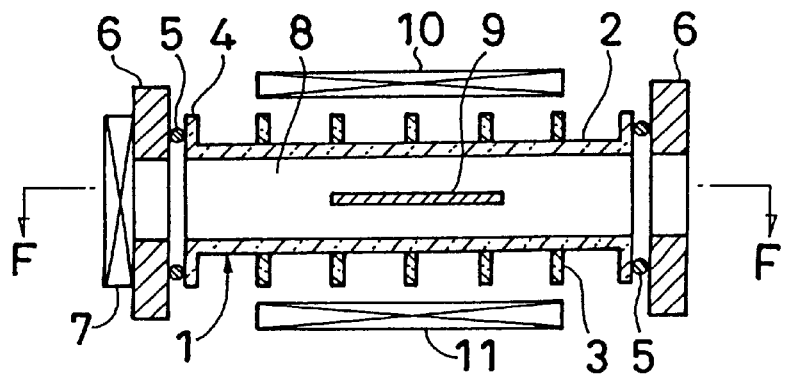

FIG. 7 (COMPARATIVE EXAMPLE)
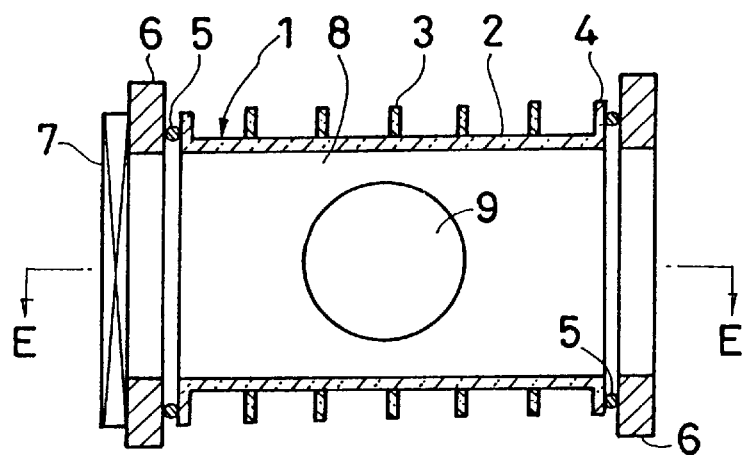
FIG. 8 (COMPARATIVE EXAMPLE)
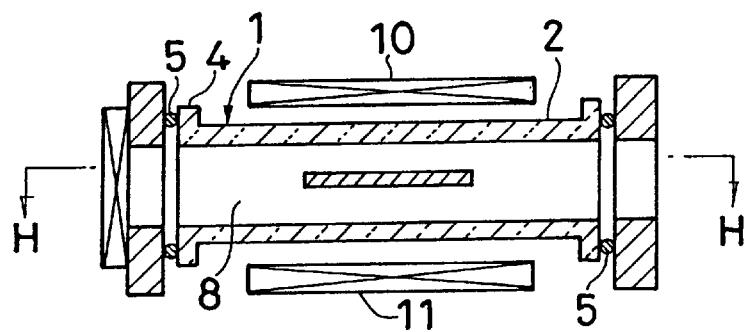
FIG. 9 (COMPARATIVE EXAMPLE)
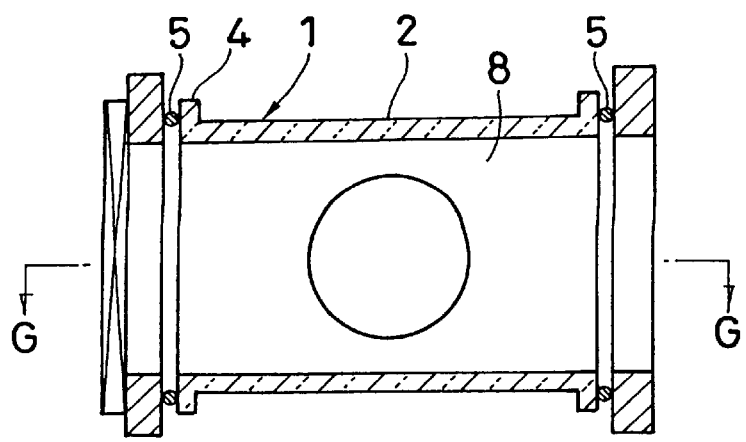

SUBSTRATE PROCESSING APPARATUS

BACKGROUND OF THE INVENTION

1. Field of the Invention

The present invention relates to a substrate processing apparatus and a substrate processing method, particularly, to a reaction furnace in a semiconductor manufacturing apparatus, and more particularly, to a reaction furnace in a single-substrate or double-substrate processing type semiconductor manufacturing apparatus which processes substrates-to-be-processed one by one or two by two.

2. Description of the Related Art

As a semiconductor manufacturing apparatus which conducts a processing such as film-formation, etching and the like on a surface of a substrate-to-be-processed such as a wafer, so as to form a large number of semiconductor elements onto the surface of the substrate-to-be-processed, there are a batch type semiconductor manufacturing apparatus which processes a number of substrates-to-be-processed at a time, and a single substrate processing type semiconductor manufacturing apparatus which processes substrates one by one.

Although the single substrate processing type semiconductor manufacturing apparatus is inferior to the batch type semiconductor manufacturing apparatus in productivity of products, the former apparatus is superior to the latter in uniformity of film qualities of a processed substrate and has the advantage that diversified requirements from customers can be satisfied. In recent years, the single substrate processing type apparatus has become mainstream.

A reaction container used for a single substrate processing type semiconductor manufacturing apparatus is of substantially rectangular parallelepiped shape in many cases. The interior of the reaction chamber is typically evacuated. Therefore, such a reaction container is required to have a strength great enough to withstand a pressure difference between the inside and outside of the container. Therefore, problems occur if the apparatus is increased in size, because manufacturing thereof becomes difficult, the structure becomes complicated and mass production efficiency is deteriorated, and the cost of materials is increased.

SUMMARY OF THE INVENTION

It is, therefore, a main object of the present invention to provide a substrate processing apparatus including a reaction container which has a strength capable of withstanding a pressure difference between inside and outside of the reaction container, and which is easily manufactured, and thus can exhibit excellent mass production efficiency and can reduce the costs of materials, and can prevent the reaction furnace from being increased in size. It is another main object of the present invention to provide a substrate processing method using such a substrate processing apparatus.

According to a first aspect of the present invention, there is provided a substrate processing apparatus, comprising a reaction container for processing a substrate therein, wherein the reaction container is provided, at a first open end portion thereof or in the vicinity of the first open end portion, with a first thin portion which is thinner than a central portion of the reaction container.

According to a second aspect of the present invention, there is provided a substrate processing method, comprising the steps of: evacuating a reaction container, and processing a substrate in the reaction container, wherein the reaction container is provided at a first end thereof with a first flange, and the reaction container is provided, inside the first flange and in the vicinity of the first flange, with a first thin portion which is thinner than a central portion of the reaction container.

BRIEF DESCRIPTION OF THE DRAWINGS

The above and further objects, features and advantages of the present invention will become more apparent from the following detailed description taken in conjunction with the accompanying drawings, wherein:

FIG. 1 is a longitudinal cross-sectional view showing an embodiment of the present invention;

FIG. 2 is a longitudinal cross-sectional view of a reaction container of the embodiment, taken along the arrows A—A in FIG. 3;

FIG. 3 is a view taken along the arrows B—B in FIG. 2;

FIG. 4 is a longitudinal cross-sectional view of another reaction container of the embodiment, taken along the arrows C—C in FIG. 5;

FIG. 5 is a view taken along the arrows D—D in FIG. 4;

FIG. 6 is a longitudinal cross-sectional view showing a comparative example, taken along the arrows E—E in FIG. 7;

FIG. 7 is a view taken along the arrows F—F in FIG. 6;

FIG. 8 is a longitudinal cross-sectional view showing another comparative example, taken along the arrows G—G in FIG. 9; and FIG. 9 is a view taken along the arrows H—H in FIG. 8.

DESCRIPTION OF THE PREFERRED EMBODIMENTS

An embodiment of the present invention will be described below with reference to FIGS. 1 to 3.

In the drawings, the reference number 15 denotes a reaction container made of quartz. The reaction container 15 comprises a cylindrical body 16 and flanges 17 welded to both ends of the cylindrical body 16. The cylindrical body 16 is formed into a flat polygonal cylindrical shape, and its both ends 18 are reduced in thickness. Each of the flanges 17 comprises a flange joint portion 19 and a weld joint portion 20. The weld joint portion 20 has the same section as that of the end 18 of the cylindrical body 16, and projects axially from the flange joint portion 19 toward the cylindrical body 16. Each of the weld joint portions 20 has the same thickness as that of the end 18. The end 18 and the weld joint portion 20 are butted to each other and welded together. A recess 21 is formed around outer peripheries of the end 18 and the weld joint portion 20.

The reaction container 15 is air-tightly provided at its both ends with metal flanges 23 with O-rings 22 interposed therebetween. A reaction container holder 24 having L-shaped section is secured to each of the flanges 23 by bolts 25, and the flange joint portion 19 is sandwiched by the flange 23 and the reaction container holder 24.

One of the flanges 23 is air-tightly provided with a gate valve 26, and the other flange 23 is connected to an exhaust apparatus (not shown). The inside of the reaction container 15 is formed to be a reaction chamber 27 of air-tight structure, and a wafer 28 can be brought into and out from the reaction chamber 27 through the gate valve 26.

An upper heater 29 is provided such as to cover an upper portion of the cylindrical body 16, and a lower heater 30 is provided such as to cover a lower portion of the cylindrical body 16. Further, outsides of the upper heater 29 and the lower heater 30 are covered with a heat insulator 31. Ends of the heat insulator 31 are formed into inner brims 32 projecting toward the center, and the inner brims 32 respectively engage with the recesses 21.

In the present embodiment, when external pressure is applied, the central portion of a wall of the cylindrical body 16 receives the greatest moment, a bending moment applied to each of the both ends 18 of the cylindrical body 16 is small. Flange joint portions 19 on the both ends function as reinforcing ribs. Therefore the fact that the thickness of the recesses 21 is thin does not cause any problem. Since the reaction container 15 and the flange 17 are joined together by butt welding of relatively thin walls, excessive thermal stress should not be generated during manufacturing of the reaction container 15 and welding can be conducted excellently.

Film formation on the wafer 28 in the reaction chamber 27 will be explained below.

One wafer 28 is brought into the reaction chamber 27 through the gate valve 26 by a wafer transfer apparatus (not shown) located outside the reaction chamber 27. The gate valve 26 is closed air-tightly, the reaction chamber 27 is evacuated to produce a vacuum and then, reaction gas is introduced. The cylindrical body 16 is heated by the upper heater 29 and the lower heater 30, and a film formation process is conducted on the wafer 28 in the reaction chamber 27.

Plate thickness of the recess 21 is thinner than that of the cylindrical body 16 so that the thermal resistance in the recess 21 is increased, and thermal transfer from the heated cylindrical body 16 to the flange joint portion 19 is suppressed. Further, since thermal radiation from the upper heater 29 and the lower heater 29 is cut by the inner brims 32 of the insulator 31, suppression of thermal transfer and cut of thermal radiation combined make it possible to suppress temperature rise of the flange joint portion 19 to the minimum. Therefore, it is possible to prevent the O-rings 22 from being heated and burnt, and deteriorated.

After the film formation has been completed, gas including reaction by-product is exhausted, and replaced by inert gas. The gate valve 26 is opened, and the wafer 28 is brought out from the reaction chamber 27 through the gate valve 26 by the wafer transfer apparatus (not shown).

Although the reaction container 15 is made of quartz in the present embodiment, it may be made of ceramics, and the flange 17 may be subjected to a sandblast treatment and the like to make the flange 17 opaque so that transmittance of radiation heat is further lowered. Further, as shown in FIGS. 4 and 5, plate thickness of each of both side plates of the cylindrical body 16 may be the same as that of the flange 17, and a plurality of reinforcing ribs 33 may be welded at required distances from one another on the side plates of the cylindrical body 16. Of course, a section of the reaction container may be flat oval shape or elliptical shape. Further, the substrate-to-be processed is not limited to the semiconductor wafer, and it may be other substrates-to-be-processed such as a glass and the like.

First Example

In the case of the reaction furnace used for film formation process of a wafer having a diameter of 8 inches, degree of vacuum in the reaction chamber 27 is kept at 0.01 to 10 torr. If outside dimension of the reaction chamber 27 is such that width 320 mm×height 80 mm×axial length 540 mm, plate thickness of the cylindrical body 16 excluding both the opposite ends 18 is set to 20 mm, plate thickness of the recess 21 is set to 10 mm, and width of the recess 21 is set to 70 mm.

Second Example

In the case of the reaction furnace used for film formation process of a wafer having a diameter of 12 inches, degree of vacuum in the reaction chamber 27 is kept at 0.01 to 10 torr. If outside dimension of the reaction chamber 27 is such that width 440 mm×height 100 mm×axial length 690 mm, plate thickness of the cylindrical body 16 excluding both the opposite ends 18 is set to 20 to 35 mm, preferably 30 to 35 mm, plate thickness of the recess 21 is set to 10 mm, and width of the recess 21 is set to 70 mm.

It is needless to say that plate thickness of the cylindrical body, plate thickness of the both ends, and width of the recess may be changed in accordance with a shape of the cylindrical body and degree of vacuum.

According to the present invention, as described above, since the recess is provided in the outer face of the reaction container and the wall thickness is made thin, weld-joining is easy, it is unnecessary to carve quartz to integrally form the flange, the cost of materials can be reduced, thermal transfer to the O-ring can be suppressed to the minimum, the O-ring can be prevented from being burnt or deteriorated, and airtightness in the reaction chamber can reliably be maintained.

Since the cylindrical body 6 has a structure capable of withstanding pressure difference between inside and outside of the reaction chamber by increasing plate thickness of the cylindrical body, it is unnecessary to join the reinforcing ribs 33 (FIG. 5) to upper and lower walls of the cylindrical body by welding. Alternatively, no reinforcing ribs may be used to reinforce cylindrical body 16 as shown in FIG. 1–FIG. 3, except for flange joint portions 19. Therefore, the cylindrical body can be manufactured easily, mass production efficiency is enhanced, manufacturing costs can be reduced, and the reaction furnace can be reduced in size.

Further, since thermal radiation from the heaters to the O-rings is cut by providing the heat insulators in the recesses, there are many effects that it is possible to prevent the O-rings from being heated, burnt and deteriorated, thermal insulating efficiency is enhanced, and energy can be saved.

Next, an outline of a comparative reaction furnace in a single substrate processing type semiconductor manufacturing apparatus with reference to FIGS. 6 and 7.

In the drawings, the reference number 1 denotes a reaction container made of quartz. The reaction container 1 comprises a flat polygonal cylindrical body 2 whose plate thickness is about 10 mm, a necessary number of reinforcing ribs 3 which are projected from the entire outer peripheral surface of the cylindrical body 2 at equal distances from one another, and flanges 4 secured to both ends of the cylindrical body 2.

The reaction container 1 is air-tightly provided at its both ends with metal flanges 6 with O-rings 5 interposed therebetween. One of the flanges 6 is air-tightly provided with a gate valve 7, and the other flange 6 is connected to an exhaust apparatus (not shown). A reaction chamber 8 of air-tight structure is defined in the reaction container 1, and a wafer 9 can be brought into and out from the reaction chamber 1 through the gate valve 7.

An upper heater 10 is provided above the reaction container 1 in parallel to an upper face of the reaction container 1, and a lower heater 11 is provided below the reaction container 1 in parallel to a lower face of the reaction container 1.

One wafer 9 is brought into the reaction chamber 8 through the gate valve 7 by a wafer transfer apparatus (not shown) located outside the reaction chamber 8. The gate valve 7 is closed air-tightly. The reaction chamber 8 is evacuated to produce a vacuum and exhausted by an exhaust apparatus (not shown). While reaction gas is introduced, the reaction chamber 8 is exhausted by the exhaust apparatus, and the interior of the reaction chamber 8 is maintained at a predetermined negative pressure. The reaction container 1 is heated by the upper heater 10 and the lower heater 11. The interior of the reaction chamber 8 is heated to high temperature and reaction gas is decomposed. The decomposed reaction gas is adhered to and deposited on the wafer 9 and film formation process is conducted. After the film formation process has been completed, gas including reaction by-product is exhausted from the reaction chamber 8 and is replaced by inert gas such as nitrogen gas and then, the gate valve 7 is opened. The wafer 9 is brought out from the reaction chamber 8 through the gate valve 7 by the wafer transfer apparatus (not shown).

As described above, in this comparative reaction furnace, in order to uniform the flow of reaction gas when a film is formed, and to uniform the thin films formed on the wafers, the reaction container 1 is formed into a flat polygonal cylindrical shape so that the upper and lower faces of the reaction container 1 and a face of the wafer 9 become parallel. When the reaction chamber 8 is under vacuum, since the outside of the reaction chamber 8 is under atmospheric pressure, a large external pressure is applied to the reaction chamber 1. Since the reaction container 1 is formed into a flat polygonal cylindrical shape as described above, a large bending moment is applied to the outer wall thereof. Therefore, it is necessary to provide a large number of reinforcing ribs 3 around the outer periphery of the reaction container 1 so that the latter can withstand pressure difference between inside and outside of the reaction chamber 8. However, if too many reinforcing ribs 3 are provided, it is necessary to anneal more than twenty times for removing a weld or thermal residual stress caused by welding, which gives a lot of trouble for manufacturing, and there is a possibility that the product is damaged during manufacture, and mass production efficiency is inferior. Further, there is a problem that the height of the reaction furnace itself is increased by the height of the reinforcing rib 3, which causes an increase of the reaction furnace in size.

Further, as shown in FIGS. 8 and 9, it seems possible to increase plate thickness of the reaction container 1 up to 20 mm or more instead of providing the reinforcing ribs 3. However, if thick quartz are welded together, since quartz has low thermal conductivity, only a portion of the quartz which is heated by a burner is increased in temperature, and the non-heated portions are not increased in temperature. Thus, thermal stress is generated due to temperature difference between the heated portion and non-heated portion, and the reaction container 1 is prone to be broken, which makes the welding extremely difficult. Therefore, quartz plate is carved into the flange 4 and the cylindrical body 2 integrally to form the reaction container 1. However, there are problems that quartz is expensive, quartz plate can not be utilized effectively, the costs of materials are increased, it takes a long time for carving, and mass production efficiency is low.

Further, if plate thickness of portions of the reaction container 1 from areas heated by the heaters 10 and 11 to the O-rings 5 are thick, an amount of heat transferred from the heaters 10 and 11 to the O-rings 5 is increased, the O-rings 5 is largely deteriorated due to burning, replacement frequency is increased, or airtightness of the reaction chamber 8 can not be maintained.

What is claimed is:

1. A substrate processing apparatus, comprising:
    a reaction container for processing a substrate therein, said reaction container including a first wall portion, a second wall portion opposite the first wall portion, and a flange having an open end, one end of said first wall portion and one end of said second wall portion terminating in said flange, a line extending substantially through said flange and a center of said reaction container defining a first direction;
    said first wall portion having a thicker central section and a thinner outlying section being thinner than the thicker central section, said thinner outlying section associated with said one end of said first wall portion, the thicker central section being longer in the first direction than the thinner outlying section; and
    said second wall portion having a thicker central section and a thinner outlying section being thinner than the thicker central section, said thinner outlying section associated with said one end of the second wall portion, the thicker central section being longer in the first direction than the thinner outlying section.

2. A substrate processing apparatus as recited in claim 1, wherein said reaction container further includes a second flange having a second open end,
    said first and second wall portions being interposed between said flanges,
    another end of the first wall portion and another end of the second wall portion terminating in the second flange,
    said first wall portion having another thinner outlying section being thinner than the thicker central section, said another thinner outlying section associated with the another end of said first wall portion, the thicker central section being longer in said first direction than the another thinner outlying section; and
    said second wall portion having another thinner outlying section being thinner than the thicker central section, said another thinner outlying section associated with the another end of the second wall portion, the thicker central section being longer in said first direction than the another thinner outlying section.

3. A substrate processing apparatus as recited in claim 1, wherein said reaction container encloses a reaction volume, said first and second wall portions being spaced apart in a first direction,
    said reaction container further including third and fourth wall portions being spaced apart in a second direction substantially perpendicular to said first direction,
    said first and second wall portions defining a greater portion of the surface of the reaction volume than said third and fourth wall portions;
    one end of said third wall portion and one end of the fourth wall portion terminating in said flange, and
    said first and second wall portions united with said third and fourth walls to form a unitary body.

4. A substrate processing apparatus as recited in claim 2, wherein said reaction container encloses a reaction volume,
    said first and second wall portions being spaced apart in a first direction;
    said reaction container further including third and fourth wall portions being spaced apart in a second direction substantially perpendicular to said first direction,
    said first and second wall portions defining a greater portion of the surface of the reaction volume than said third and fourth wall portions, said third and fourth wall portions are interposed between said flanges, ends of said third wall portion and the fourth wall portion terminating in said flanges;

said first and second walls being united with said third and fourth walls to form a unitary body.

5. A substrate processing apparatus as recited in claim 3, wherein said thicker central sections of said first and second wall portions are greater in thickness than said third and fourth wall portions.

6. A substrate processing apparatus as recited in claim 4, wherein said thicker central sections of said first and second wall portions are greater in thickness than said third and fourth wall portions.

7. A substrate processing apparatus as recited in claim 1, wherein said flange is provided with first and second flange connecting portions, said thicker central section of said first wall portion being thicker than said first flange connecting portion, and said thicker central portion of said second wall portion being thicker than said second flange connecting portion, and said thinner outlying sections of said first and second walls being welded or fused to said first and second flange connecting portions.

8. A substrate processing apparatus as recited in claim 2, wherein said flange is provided with first and second flange connection portions, said thicker central section of said first wall portion being thicker than said first flange connecting portion, and said thicker central section of said second wall portion being thicker than said second flange connection portion;

said thinner outlying sections of said first and second wall portions being welded or fused to said first and second flange connecting portions respectively;

said second flange having third and fourth flange connecting portions, said thicker central section of said first wall portion being thicker than said third flange connecting portions, and said thicker central section of said second wall portion being thicker than said fourth flange connecting portion, and said another thinner outlying sections of said first and second wall portions being welded or fused to said third and fourth flange connecting portions, respectively.

9. A substrate processing apparatus as recited in claim 1, further comprising a coupling member for interfacing with said flange of said reaction container, and a hermetical seal for mounting between said flange and said coupling member, the hermetical seal composed of a material selected from the group consisting of resin and rubber.

10. A substrate processing apparatus as recited in claim 2, further comprising first and second coupling members for interfacing with to said flanges of said reaction container, and hermetical seals for mounting between said first and second flanges and said first and second coupling members, respectively, the hermetical seals composed of a material selected from the group consisting of resin and rubber.

11. A substrate processing apparatus as recited in claim 9, wherein a first recess in an outer surface of said first wall portion to form said thinner outlying section of said first wall portion, and a second recess in an outer surface of said second wall portion to form said thinner outlying section of said second wall portion, said substrate processing apparatus further comprising a heating device provided outside said thicker central section of said first and second wall portions, and heat insulators provided in said first and second recesses.

12. A substrate processing apparatus as recited in claim 10, wherein first and second recesses in outer surfaces of said first wall portion and second wall portion, respectively, the first and second recesses forming said thinner outlying sections of said first wall portion and the second wall portion, third and fourth recesses in outer surfaces of said first and second wall portions, respectively, the third and fourth recesses forming said another thinner outlying sections, and said substrate processing apparatus further comprising a heating device provided outside said thicker central sections of said first and second wall portions, and heat insulators respectively provided in said first, second third and fourth recesses.

13. A substrate processing apparatus, comprising:

a reaction container for processing a substrate therein, said reaction container including a first wall portion, a second wall portion opposite the first wall portion, and a flange having an open end, one end of said first wall portion and one end of said second wall portion terminating in said flange;

said first wall portion having a thicker central section and a thinner outlying section being thinner than the thicker central section, said thinner outlying section associated with said one end of said first wall portion, the thicker central section being longitudinally longer than the thinner outlying section; and said second wall portion having a thicker central section and a thinner outlying section being thinner than the thicker central section, said thinner outlying section associated with said one end of the second wall portion.

14. A substrate processing apparatus, comprising:

a reaction container for processing a substrate therein, said reaction container having a container wall, a flange extending from one end of said container wall, and a recess provided at an outside surface of said container wall in proximity to said flange;

a reaction container coupling member to be coupled to said flange;

a hermetical seal between said flange and said reaction container coupling member;

a heating device provided outside said container wall; and a thermal insulator provided in said recess.

15. A substrate processing apparatus as recited in claim 14, wherein the hermetical seal is composed of a material selected from the group consisting of rubber and resin.

* * * * *

UNITED STATES PATENT AND TRADEMARK OFFICE
CERTIFICATE OF CORRECTION

PATENT NO. : 6,132,553 Page 1 of 1
DATED : October 17, 2000
INVENTOR(S) : Fumihide Ikeda et al.

It is certified that error appears in the above-identified patent and that said Letters Patent is hereby corrected as shown below:

<u>Title page,</u>
Item [73], Assignee, please change the assignee's name from "Kokasai Electric Co., Ltd." to -- Kokusai Electric Co., Ltd. --.

Signed and Sealed this

Eleventh Day of May, 2004

JON W. DUDAS
*Acting Director of the United States Patent and Trademark Office*